US012775053B2

(12) United States Patent
Hoffmann et al.

(10) Patent No.: US 12,775,053 B2
(45) Date of Patent: Oct. 27, 2026

(54) WAVELET-ADAPTIVE INTERFERENCE CANCELLATION FOR UNDERDETERMINED PLATFORMS

(71) Applicant: The Regents of The University of Michigan, Ann Arbor, MI (US)

(72) Inventors: Alex Hoffmann, Ann Arbor, MI (US); Mark B. Moldwin, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 148 days.

(21) Appl. No.: 18/768,522

(22) Filed: Jul. 10, 2024

(65) Prior Publication Data

US 2025/0020739 A1 Jan. 16, 2025

Related U.S. Application Data

(60) Provisional application No. 63/526,516, filed on Jul. 13, 2023.

(51) Int. Cl.

| | |
|---|---|
| ***G01R 33/02*** | (2006.01) |
| ***G01R 33/022*** | (2006.01) |
| ***G01R 33/025*** | (2006.01) |
| ***H04N 19/103*** | (2014.01) |
| ***H04N 19/105*** | (2014.01) |
| ***H04N 19/11*** | (2014.01) |

(52) U.S. Cl.

CPC ....... *G01R 33/0206* (2013.01); *G01R 33/022* (2013.01); *G01R 33/025* (2013.01); *H04N 19/103* (2014.11); *H04N 19/105* (2014.11); *H04N 19/11* (2014.11)

(58) Field of Classification Search

CPC ......................... G01R 33/0206; G01R 33/025; G01R 33/022; H04N 19/103; H04N 19/105; H04N 19/11

USPC .......................................................... 324/244

See application file for complete search history.

(56) References Cited

U.S. PATENT DOCUMENTS

| | | | | |
|---|---|---|---|---|
| 2016/0041234 A1* | 2/2016 | Li | G01V 3/081 324/202 |
| 2018/0003777 A1* | 1/2018 | Sorensen | G01R 35/00 |
| 2018/0231619 A1* | 8/2018 | Li | G01V 13/00 |
| 2019/0391213 A1* | 12/2019 | Alford | G01R 33/0094 |
| 2020/0209328 A1* | 7/2020 | Alford | G01R 33/26 |
| 2021/0080522 A1* | 3/2021 | Alford | G01R 33/0017 |

* cited by examiner

*Primary Examiner* — Raul J Rios Russo

(74) *Attorney, Agent, or Firm* — Harness, Dickey & Pierce, P.L.C.

(57) ABSTRACT

An interference removal technique, called Wavelet-Adaptive Interference Cancellation for Underdetermined Platforms (WAIC-UP), is provided to effectively eliminate stray magnetic field signals using multiple magnetometers, without requiring prior knowledge of the spectral content, location, or magnitude of the interference signals. WAIC-UP capitalizes on the distinct spectral properties of various interference signals and employs an analytical method to separate them from ambient magnetic field in the wavelet domain.

15 Claims, 6 Drawing Sheets

TABLE I

Summary of Three Magnetometer Results.

| | ρ | SNR (dB) | RMSE (nT) | Time (s) |
|---|---|---|---|---|
| Minimum | 0.6843 | -0.649 | 259.68 | — |
| UBSS | 0.9993 | 28.75 | 8.79 | 44.35 |
| WAIC-UP | 0.9993 | 28.48 | 9.08 | 1.78 |

FIG. 11

TABLE II

Summary of Quad-Mag Results.

| | ρ | SNR (dB) | RMSE (nT) | Time (s) |
|---|---|---|---|---|
| Minimum | 0.8075 | 2.76 | 42.33 | — |
| UBSS | 0.9971 | 22.33 | 4.40 | 102.78 |
| WAIC-UP | 0.9964 | 21.42 | 4.94 | 4.61 |

FIG. 12

TABLE III

Median Results of Randomized Stray Magnetic Field Simulations

| | ρ | SNR (dB) | RMSE (nT) |
|---|---|---|---|
| Average | 0.6295 | -2.42 | 76.88 |
| Minimum | 0.2468 | -12.39 | 26.31 |
| WAICUP | 0.9937 | 14.21 | 11.33 |

FIG. 13

WAVELET-ADAPTIVE INTERFERENCE CANCELLATION FOR UNDERDETERMINED PLATFORMS

CROSS-REFERENCE TO RELATED APPLICATIONS

This application claims the benefit of U.S. Provisional Application No. 63/526,516, filed on Jul. 13, 2023. The entire disclosure of the above application is incorporated herein by reference.

GOVERNMENT INTEREST

This invention was made with government support under 80GSFC20C0075 and 80NSSC22M0104 awarded by the National Aeronautics and Space Administration. The government has certain rights in the invention.

FIELD

The present disclosure relates to spacecraft magnetic field measurements and, more particularly, relates to a wavelet-adaptive interference cancellation method and system for eliminating stray magnetic field signals using multiple magnetometers.

BACKGROUND & SUMMARY

This section provides background information related to the present disclosure which is not necessarily prior art. This section provides a general summary of the disclosure, and is not a comprehensive disclosure of its full scope or all of its features.

Magnetometers are used on spacecraft to measure the heliospheric magnetic field, Earth's magnetosphere, and other planetary magnetospheres. However, spacecraft electrical systems can generate stray magnetic fields which interfere with the measurements of natural ambient magnetic field. To minimize this interference, magnetometers are typically positioned at the end of a mechanical boom. For example, the future mission to Mars, Escape and Plasma Acceleration and Dynamics Explorers (EscaPADE), consists of two SmallSats, each equipped with magnetometers on the end of a 90 cm boom. However, satellite booms increase the cost and complexity of spacecraft designs, limiting their adoption for small as well as some large complex satellites. Consequently, numerous space exploration missions have forgone the inclusion of a magnetometer altogether (e.g., the NASA Dawn and New Horizons missions).

Various techniques have been developed to eliminate stray magnetic fields from spacecraft measurements using multiple magnetometers without a boom. Some of these techniques employ Principal Component Analysis (PCA) or Independent Component Analysis (ICA) to isolate stray magnetic field signals based on their statistical properties. However, these methods presuppose fewer noise sources than magnetometers or magnetometer axes. This is rarely the case since spacecraft typically have many electrical subsystems.

A more generalized approach, Underdetermined Blind Source Separation (UBSS), relies on cluster analysis and compressive sensing to separate signals based on their spectral composition. Although UBSS outperforms PCA and ICA, it is computationally demanding and necessitates that the interference and ambient magnetic field signals have sparse spectral signatures. This strict assumption of spectral sparsity may not be applicable to every spacecraft magnetic field environment.

Another technique, Multivariate Singular Spectrum Analysis (MSSA), decomposes time series measurements using an eigenvalue decomposition without relying on assumptions about source signals. However, selecting the appropriate components to reconstruct the ambient magnetic field proves challenging and is prone to user error.

According to the principles of the present teachings, a novel algorithm, Wavelet Adaptive Interference Cancellation for Underdetermined Platforms (WAIC-UP), is provided that is designed to remove stray magnetic fields from boomless spacecraft magnetometer measurements. The algorithm leverages the statistical correlation between magnetometer signals' wavelet coefficients to identify interference signals. WAIC-UP expands upon the method of A. Sheinker and M. B. Moldwin, "Adaptive interference cancellation using a pair f magnetometers" IEEE Transactions of Aerospace and Electronic System, vol. 52, no. 1, pp 307-318, February 2016, doi10.11091TAES.2015.150192, which separates a single interference signal using two magnetometers. This method is ill-suited for boomless platforms with multiple interference sources that cannot be modeled as a single dipole field. However, by applying the method on a wavelet basis, WAIC-UP can accommodate multiple interference sources with distinct spectral characteristics.

According to an aspect of the present disclosure a magnetometer system for measuring magnetic field for navigation of a spacecraft and providing a magnetically clean signal includes at least a pair of magnetometers operably coupled to a body of the spacecraft. The at least pair of magnetometers being exposed to multiple stray magnetic field signals from onboard electrical systems. The magnitude and frequency of these stray magnetic field signals vary according to the spacecraft's configuration and operation mode. The at least a pair of magnetometers outputting a mixed magnetometer signal in a discrete-time domain. An application system detrends the mixed magnetometer signal and applies a wavelet-transform to the mixed magnetometer signals. The difference between the magnetometer signals is calculated and a correlation is taken with the difference in the magnetometer signal and that correlation gives the interference signal. The interference signal is subtracted from the original signals and a filtered resultant signal is output to be used in the navigation system.

According to a further aspect, the wavelet-transform is a continuous Morlet wavelet-transform function.

According to a further aspect, the application system is on-board the spacecraft.

According to a further aspect, the application system is on the ground.

According to a further aspect, the at least a pair of magnetometers include three magnetometers.

Furthermore, WAIC-UP can employ more than two magnetometers to enhance its performance and reliability. The WAIC-UP algorithm assumes that the ambient magnetic field is uniform across the magnetometers, the interference signals are uncorrelated with the ambient magnetic field, the interference signals have varying amplitudes at different magnetometers, and each wavelet scale contains fewer interference signals than magnetometers.

In the present disclosure, the analytical foundation of the WAIC-UP algorithm is disclosed and describes three experimental procedures employed to validate its performance. The first two experiments utilize publicly available data from two mock CubeSat experiments to demonstrate the separation of real magnetic field data produced by current-driven copper coils from spacecraft magnetic field measurements. The second experiment presents a statistical analysis of thousands of 1U CubeSat simulations using randomized stray magnetic field signals and source locations. The implementation of the WAIC-UP algorithm enables high quality magnetic field measurements on boomless platforms, ultimately reducing the cost and complexity of spacecraft design and paving the way for new opportunities in small-satellite-based space science missions.

Accordingly, spacecraft magnetic field measurements are frequently degraded by stray magnetic fields originating from onboard electrical systems. These interference signals can mask the natural ambient magnetic field, reducing the quality of scientific data collected. Traditional approaches involve positioning magnetometers on mechanical booms to minimize the influence of the spacecraft's stray magnetic fields. However, this method is impractical for resource-constrained platforms, such as CubeSats, which necessitate compact and cost-effective designs. In this work, an interference removal technique is introduced called Wavelet-Adaptive Interference Cancellation for Underdetermined Platforms (WAIC-UP). This method effectively eliminates stray magnetic field signals using multiple magnetometers, without requiring prior knowledge of the spectral content, location, or magnitude of the interference signals. WAIC-UP capitalizes on the distinct spectral properties of various interference signals and employs an analytical method to separate them from ambient magnetic field in the wavelet domain. We validate the efficacy of WAIC-UP through a statistical simulation of randomized 1U CubeSat interference configurations, as well as with real-world magnetic field signals generated by copper coils. The findings demonstrate that WAIC-UP consistently retrieves the ambient magnetic field under various interference conditions and does so with orders of magnitude less computational time compared to other modern noise removal algorithms. By facilitating high-quality magnetic field measurements on boomless platforms, WAIC-UP presents new opportunities for small-satellite-based space science missions.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 3:
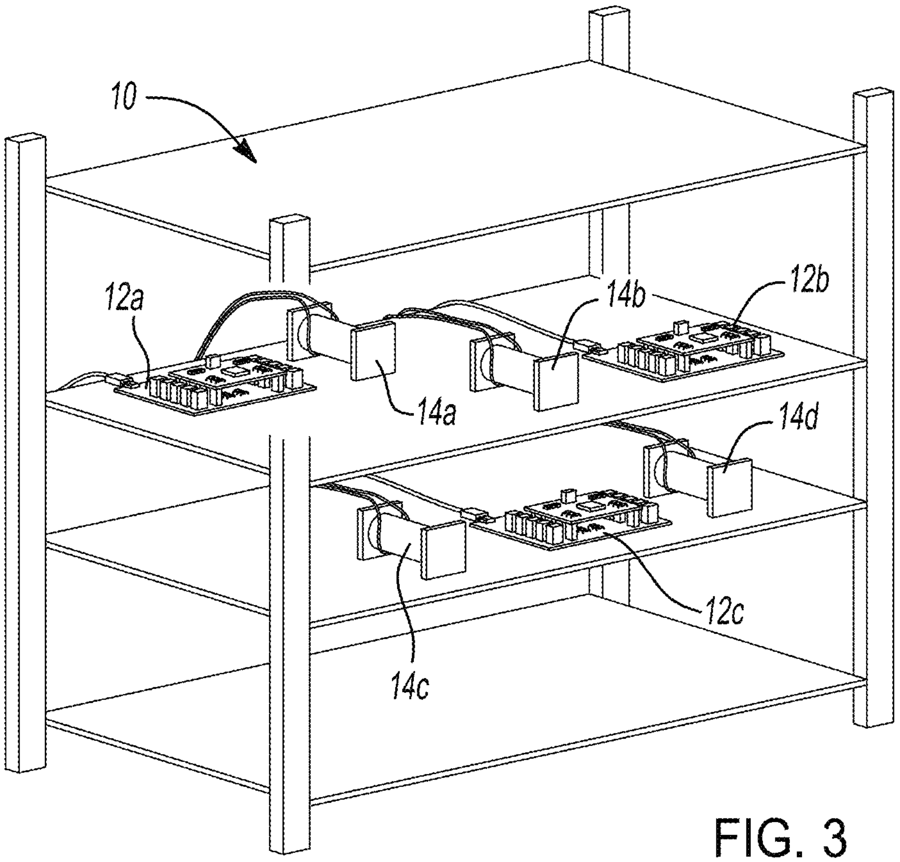

FIG. 3 illustrates an experimental setup 10 with the mock CubeSat apparatus, three PNI RM3100 magnetometers 12*a*-12*c*, and four copper coils 14*a*-14*d* driven by signal generators. The mock CubeSat is placed within a copper room to act as a shield can, blocking stray magnetic fields from the surrounding environment that are not part of the experiment.

Figure 4:
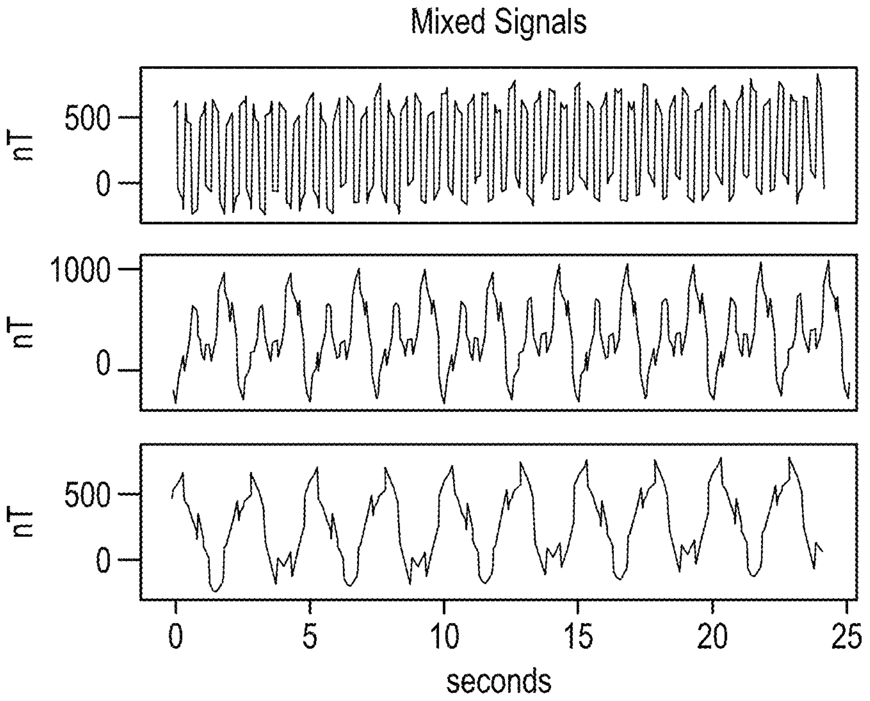

FIG. 4 illustrates plots (a), (b), and (c) depicting 20 seconds of mixed stray magnetic field data recorded by three PNI RM3100 magnetometers.

Figure 5:
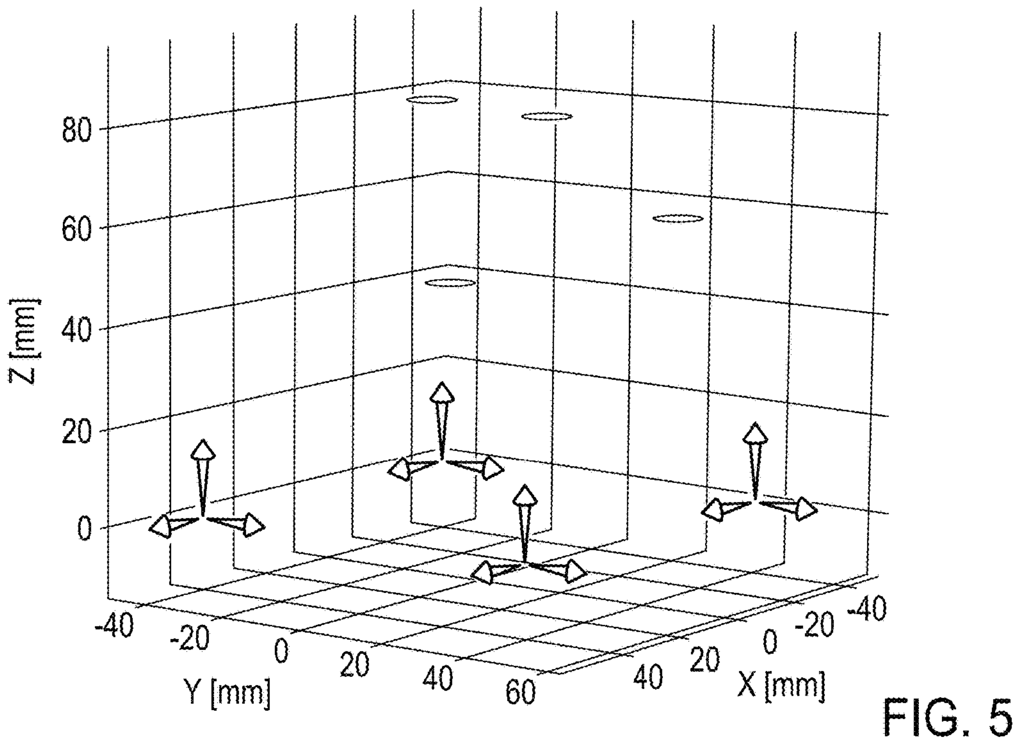

FIG. 5 illustrates a 1U CubeSat with four dipole interference sources (rings) and four virtual magnetometers (tri-color vectors). The interference sources have different positions in millimeters: (−33, 22, 18), (−18, −35,73), (47, 7, 70), and (33, −2, 36).

Figure 6:
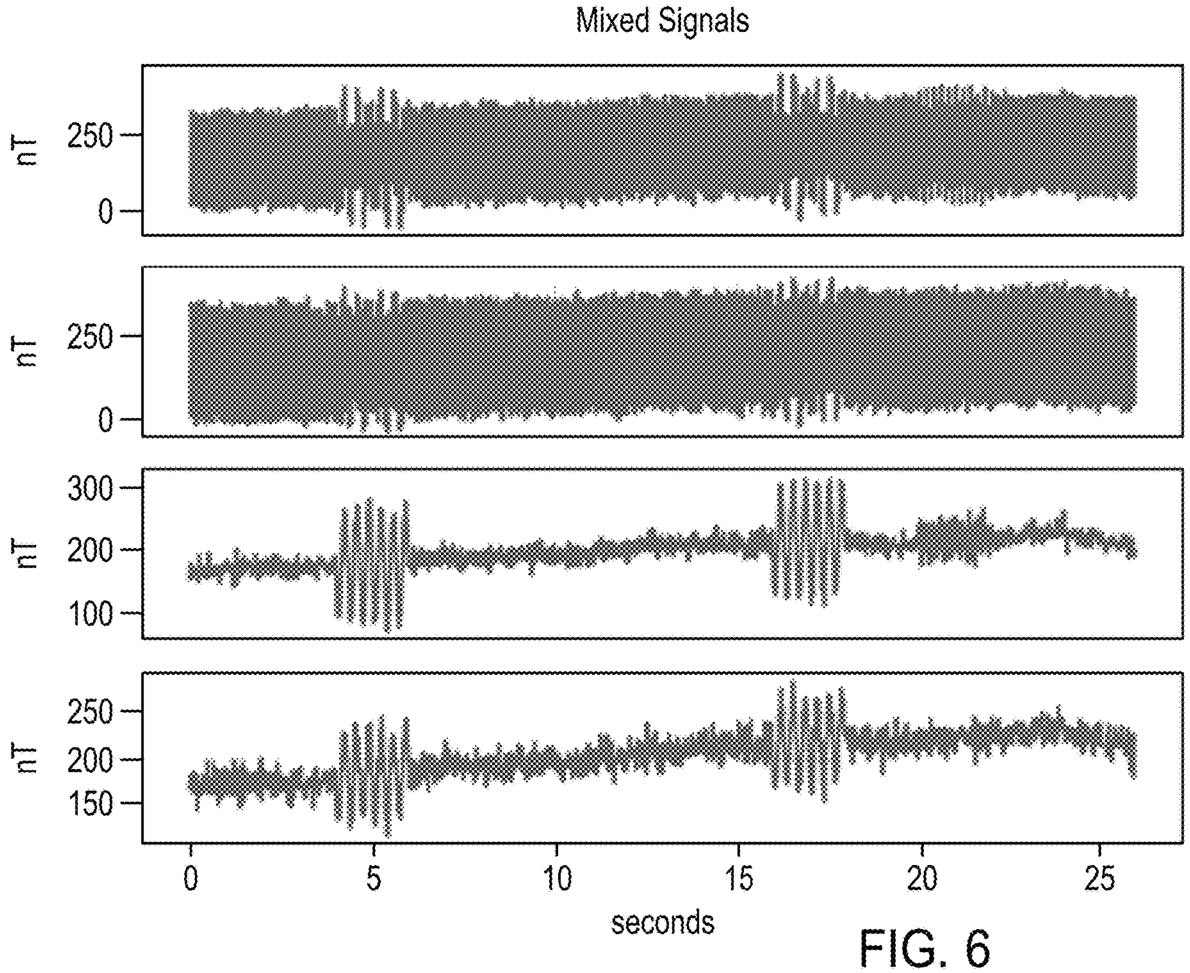

FIG. 6 illustrates 26 seconds of mixed magnetometer data. The virtual magnetometers are in a quad-mag configuration and sampled the signals at 50 Hz with 10 nT of random normal noise added.

Figure 7:
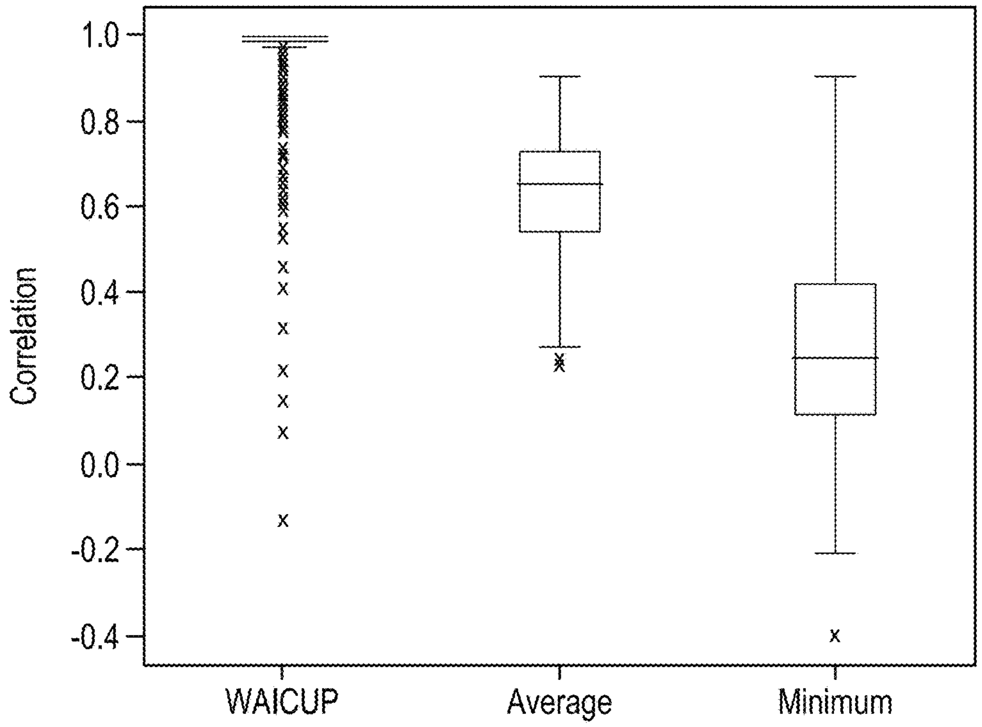

FIG. 7 illustrates a plot that shows the boxplots of the correlation of the true ambient magnetic field signal with the minimum, averaged signal, and WAIC-UP signals.

Figure 8:
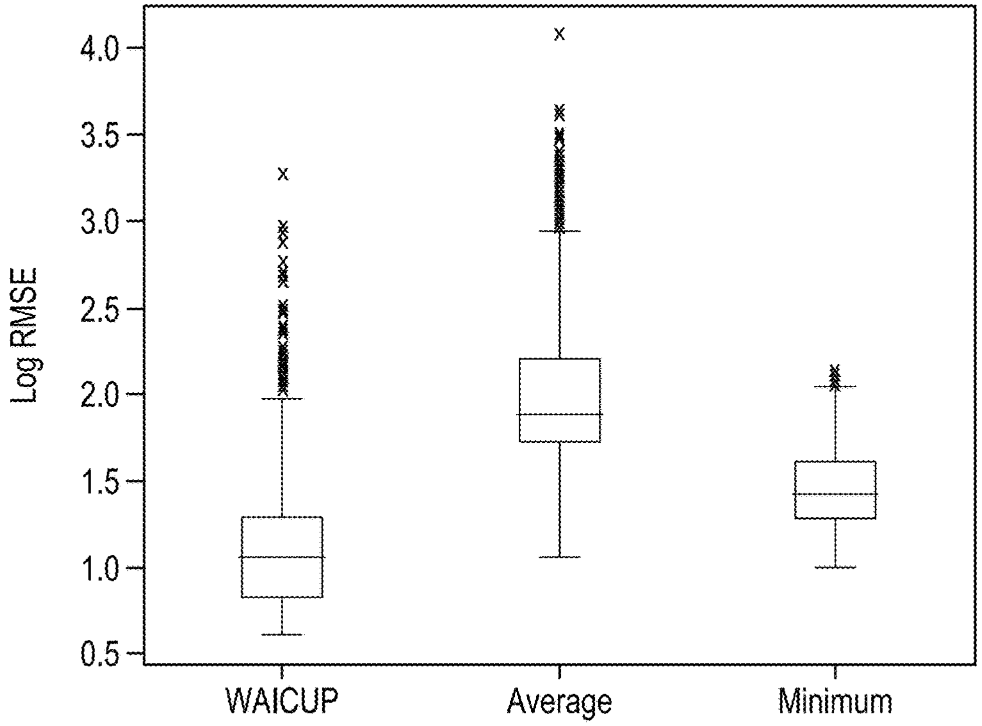

FIG. 8 illustrates a plot that shows the boxplots of the log-transformed root mean square error (RMSE) values for the raw magnetometer signal from a single magnetometer, the averaged signal, and the signal cleaned with WAIC-UP. The RMSE values are measured in nanotesla (nT).

Figure 9:
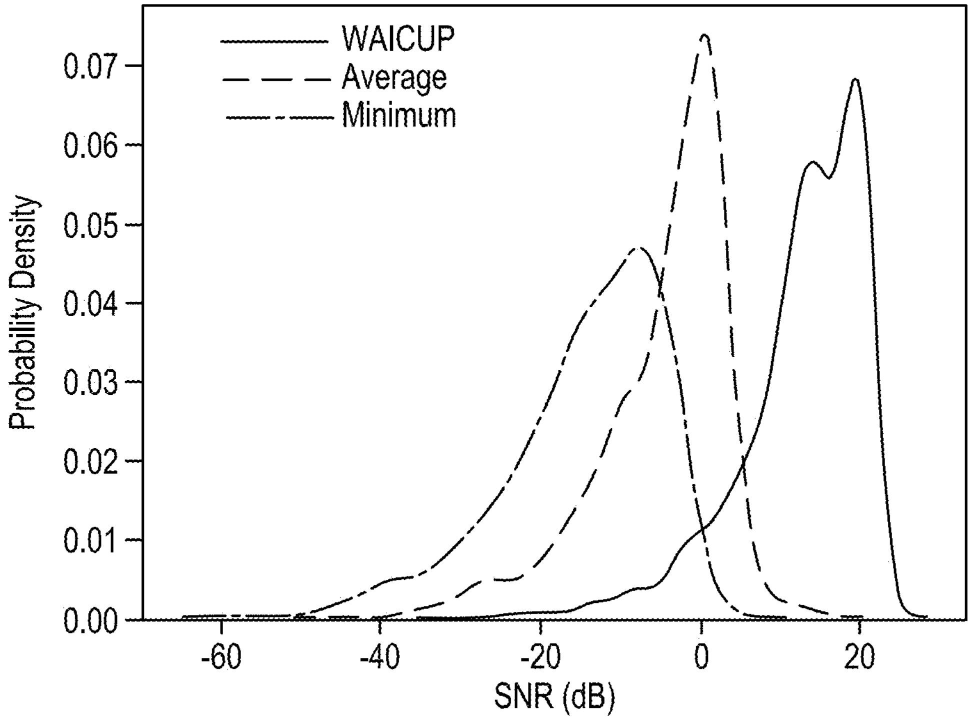

FIG. 9 illustrates the probability distribution function of the SNR values for the minimum, averaged, and WAIC-UP signals over the 1550 randomized simulations.

Figure 10:
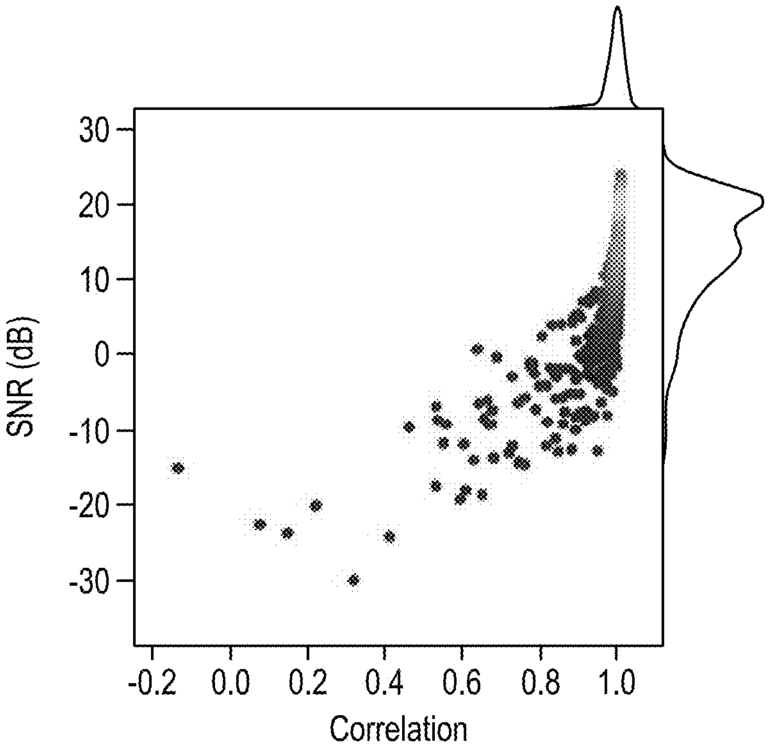

FIG. 10 illustrates the distribution of the correlation and SNR of the WAIC-UP signals. The top panel displays the probability distribution of the correlation, while the right panel exhibits the probability distribution of the SNR.

FIG. 11 illustrates a summary of three magnetometer results.

FIG. 12 illustrates a summary of quad-mag results.

FIG. 13 illustrates median results of randomized stray magnetic field simulations.

Corresponding reference numerals indicate corresponding parts throughout the several views of the drawings.

DETAILED DESCRIPTION

Example embodiments will now be described more fully with reference to the accompanying drawings. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Methodology

A. Linear Mixing Model for Magnetic Field Measurements

Figure 1:
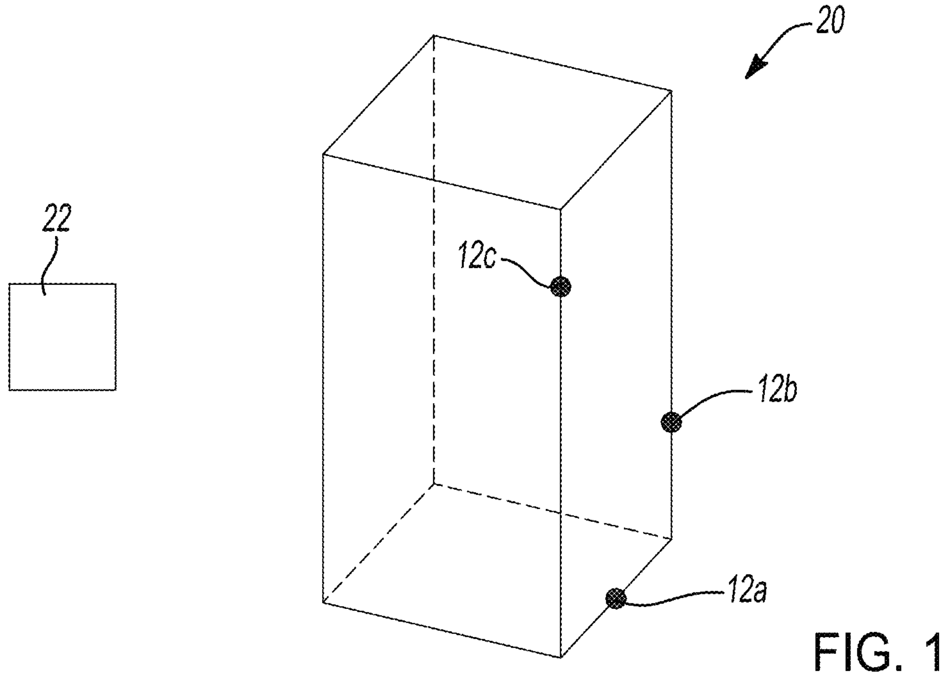
FIG. 1 is a schematic view of a spacecraft having a magnetometer system with wavelet-adaptive interference cancellation according to the principles of the present disclosure.

In this section, as shown in FIG. 1, a spacecraft 20 equipped with multiple magnetometers 12*a*-12*c* is considered that measure both the ambient magnetic field and time-varying stray magnetic fields. Since there are more interference sources than magnetometers 12*a*-12*c*, reconstructing the ambient magnetic field from these measurements is an underdetermined problem. The multiple magnetometers 12*a*-12*c* each provide signals to a processor 22 that processes the signals from the magnetometers 12 as will be described herein. The processor 22 can be an on-board processor or a processor on the ground or on another spacecraft.

A common approach to simplify this problem is to place the magnetometers 12 on a mechanical boom in a colinear arrangement, enabling multiple stray magnetic fields to be approximated as a single dipole field. This results in a linear mixing model given by:

$$\begin{bmatrix} B_{out}(t,k) \\ B_{in}(t,k) \end{bmatrix} = \begin{bmatrix} 1 & 1 \\ 1 & k \end{bmatrix} \begin{bmatrix} S_1(t,k) \\ S_2(t,k) \end{bmatrix} \quad (1)$$

Here, $S_1(t,k)$ represents the ambient magnetic field signal, $S_2(t,k)$ denotes the accumulated stray magnetic field signal, and k is a gain factor that defines the magnitude difference between the inboard and outboard magnetometers.

However, this approach is not feasible for boomless platforms where multiple interference sources cannot be modeled as a single dipole field. In this situation, a more general linear mixing model is given by:

$$\begin{bmatrix} B_1(t,k) \\ \vdots \\ B_m(t,k) \end{bmatrix} = \begin{bmatrix} 1 \\ \vdots \\ 1 \end{bmatrix} \begin{bmatrix} k_{12} & \dots & k_{1n} \\ \vdots & \ddots & \vdots \\ k_{m2} & \dots & k_{mn} \end{bmatrix} \begin{bmatrix} S_1(t,k) \\ \vdots \\ S_n(t,k) \end{bmatrix} \quad (2)$$

In this equation, m is the number of magnetometers and n is the number of interference sources ($m<n$). This system has an infinite solution space, necessitating sophisticated demixing algorithms like compressive sensing.

The WAIC-UP algorithm exploits the statistical correlation between wavelet coefficients of magnetometer signals to separate the ambient magnetic field from interference signals. WAIC-UP extends the method in which removes a single interference signal using two magnetometers. However, WAIC-UP can handle multiple interference sources with different spectral characteristics using two or more non-colinear magnetometers on a boomless platform. WAIC-UP achieves this by approximating the complex time-domain linear mixing system in (Eq. 2) as the mixing system in (Eq. 1) in the time-scale domain.

B. Wavelet-Based Interference Estimation for Two Magnetometers

In this section, an extension of an adaptive interference removal technique is introduced for estimating and removing stray magnetic field signals from mixed magnetometer measurements using a wavelet-transform. As shown in FIG. 1, a spacecraft 20 is considered with two magnetometers 12 mounted on its body. The magnetometers are exposed to multiple stray magnetic field signals from onboard electrical systems 24. The magnitude and frequency of these signals vary according to the spacecraft's configuration and operation mode. We do not assume any prior knowledge of the interference source locations or spectral contents, except that the interference signal is uncorrelated with the ambient magnetic field signal.

The mixed magnetometer signals in the discrete-time domain, denoted as $b_1(n)$ and $b_2(n)$, contain both the ambient magnetic field signal and the stray magnetic field signals. The first step of the WAIC-UP algorithm is to detrend the data using a uniform filter. WAIC-UP is sensitive to low-frequency interference whose time frequency estimation is invalid due to the shrinking cone of influence at low frequencies. After detrending the data, the wavelet-transform is applied to these signals using a Morlet wavelet function $$\psi(\eta) = \pi^{\frac{1}{4}} e^{i\omega_0\eta} e^{-\eta^2/2},$$

where $\omega_0$ is a non-dimensional frequency variable and $\eta$ is a non-dimensional time parameter. The wavelet-transform is defined as:

$$W(s)=\sum_{n'=0}^{N-1} b(n')\psi^*\left(\frac{n'-n}{s}\right)dt \tag{3}$$

The scale parameter s determines the frequency resolution, and the translation parameter n' determines the time resolution of the wavelet-transform. The complex conjugate of ψ is denoted by ψ*. The wavelet-transform generates a series of coefficients, W(s), that reveal the time-frequency spectrum of the magnetometer signals, b(n).

We represent the wavelet series of $b_1$(n) and $b_2$(n) as $W_1$(s) and $W_2$(s). For each scale s, these series can be expressed as:

$$\begin{cases} W_1(s)=X(s)+A(s)+\omega_1(s) \\ W_2(s)=X(s)+KA(s)+\omega_2(s) \end{cases} \tag{4}$$

In these equations, X(s) represents the wavelet series of the ambient magnetic field signal to recover, A(s) denotes the wavelet series of the stray magnetic field signals at each scale, K is the gain factor indicating the influence of the interference signal at each magnetometer, and $\omega_1$(s) and $\omega_2$(s) are random normal noise terms accounting for measurement errors.

The objective is to estimate the ambient magnetic field, X(s), by identifying and eliminating A(s). To accomplish this, two unknown parameters are estimated: K and A(s). The algorithm's first step is to estimate the gain, K, for each wavelet scale. Following that, the stray magnetic field signal at each scale is estimated and the estimated interference signal is subtracted from the mixed magnetometer signals to reconstruct the wavelet coefficients of the ambient magnetic field signal.

To estimate the gain, K, at each wavelet scale, the difference between the noisy magnetometer measurements, $W_1$(s) and $W_2$(s), is computed thereby eliminating X(s) from (Eq. 4).

$$\begin{cases} D(s)=W_2(s)-W_1(s) \\ D(s)=(K-1)A(s)+\omega_2(s)-\omega_1(s) \end{cases} \tag{5}$$

Assuming that the interference signals and ambient magnetic field signal are uncorrelated, calculating the correlation of the signal difference, D(s), with the noisy magnetometer data, $W_1$(s) and $W_2$(s), yields:

$$\begin{cases} C_1=\sum D(s)W_1(s) \\ C_1=K(K-1)\sum A^2(s)+\sum \omega_2^2(s) \end{cases} \tag{6}$$

$$\begin{cases} C_2=\sum D(s)W_2(s) \\ C_2=K(K-1)\sum A^2(s)+\sum \omega_2^2(s) \end{cases} \tag{7}$$

Note that while the correlation term, $C_1$, has a factor of K−1, the correlation term, $C_2$, has a factor of K(K−1). Dividing $C_2$ by $C_1$ provides an estimation, $\hat{K}$, of the gain, K.

$$\hat{K}=\frac{C_2}{C_1}=\frac{K(K-1)\sum A^2(s)+\sum \omega_2^2(s)}{(K-1)\sum A^2(s)-\sum \omega_1^2(s)} \tag{8}$$

If the power of the stray magnetic field signal, $\Sigma A^2(s)$, is significantly larger than the random normal noise signals, $$\sum \omega_1^2(s) \text{ and } \sum \omega_2^2(s),$$

then the estimator $\hat{K}$ will converge to K.

Using the estimated gain, $\hat{K}$, the interference signal, A(s), is calculated with the following equation:

$$A(s)=\frac{W_2(s)-W_1(s)}{\hat{K}-1} \tag{9}$$

With the stray magnetic field signal estimate, it can be subtracted from the magnetometer signals to obtain the wavelet coefficients of the ambient magnetic field, as shown in (Eq. 10).

$$X(s)=\frac{\hat{K}W_1(s)-W_2(s)}{\hat{K}-1} \tag{10}$$

Having removed the stray magnetic field interference from the mixed magnetometer measurements, the time series signal of the ambient magnetic field is reconstructed utilizing (Eq. 11):

$$b(n)=\frac{\delta j\delta t^{1/2}}{C_\delta \Psi_0(0)}=\sum_{j=1}^{J}\frac{\mathbb{R}\{X(s_j)\}}{s_j^{1/2}} \tag{11}$$

In this equation, $C_\delta$ represents a scale-independent constant dependent on the wavelet function. The term $\psi_0(0)$ corresponds to the value of the wavelet function at zero, which, for a Morlet wavelet function, is π−¼. For a Morlet wavelet function, $C_\delta$ is approximately 0.776. The term δj denotes the spacing between discrete scales, and dt refers to the sampling period of the time series. Lastly, Re(X($s_j$)) is the real part of the wavelet coefficients of the ambient magnetic field signal.

C. Generalizing WAIC-UP for Multiple Magnetometers

In situations where stray magnetic field signals are present at mutually exclusive wavelet scales, the mixing system of the interference and ambient magnetic field signals can be described by (Eq. 1). In such cases, the WAIC-UP algorithm is capable of identifying and removing stray magnetic field interference. However, if multiple different interference signals exist within the same wavelet-scale, the mixing system is defined by (Eq. 2). The adaptive interference removal algorithm described earlier would be unable to estimate the gains for each interference signal in this scenario. Nevertheless, for spacecraft equipped with more than two magnetometers, it is possible to find the pairwise combination of magnetometers with the least interference.

We apply the algorithm from section B (denoted as the function clean( )) to each pair of magnetometers. The magnetometer signals are represented as B(n)=[$b_1$(n), $b_2$(n) . . . $b_m$(n)], and their wavelet series as W(s)= [$W_1$(s), $W_2$(s) . . . $W_m$(s)], obtained using (Eq. 3). We estimate a series of ambient magnetic field signals X(s)=[$X_1$(s), $X_2$(s) . . . $X_Z$(s)], where $$Z = \frac{M(M-1)}{2}$$

is the number of unique pairs. We define a new ambient magnetic field signal, $X_f(s)$, by selecting the minimum magnitude among X(s) for each scale and time point. The algorithm is summarized as follows:

Algorithm 1 WAIC-UP for Multiple Magnetometers

```
Input: B(n)
Output: x(n)
      Initialization :
 1:   W(s) = Ψ{B(n)}
 2:   Pairs = (i,j) | i ∈ range(m) and j ∈ range(i + 1, m)
      Clean All Pairwise Combinations
 3:   for (i,j) ∈ Pairs do
 4:     X(s) ← X(s) + [clean(W_i(s), W_j(s))]
 5:   end for
      Save Time-Scale Points with Minimum Interference
 6:   for (τ,s_j) ∈ (τ ∈ T,j = 1,...,J) do
 7:     i = argmin(|X(s_j,τ)|)
 8:     X_f(s_j,τ) ← X_i(s_j,τ)
 9:   end for
10:   x(n) = Ψ^-1{X_f(s)}
11:   return x(n)
```

Owing to the spatial structure of magnetic fields (i.e., dipolar, quadrupolar, etc.), it is highly likely that some stray magnetic fields may not appear at all on the axis of one magnetometer while having a large magnitude at another magnetometer. As a result of this spatial structure, the performance of the WAIC-UP algorithm improves with each additional spatially distributed magnetometer.

Experimental Evaluation of WAIC-Up with Real and Simulated Data

Figure 2:
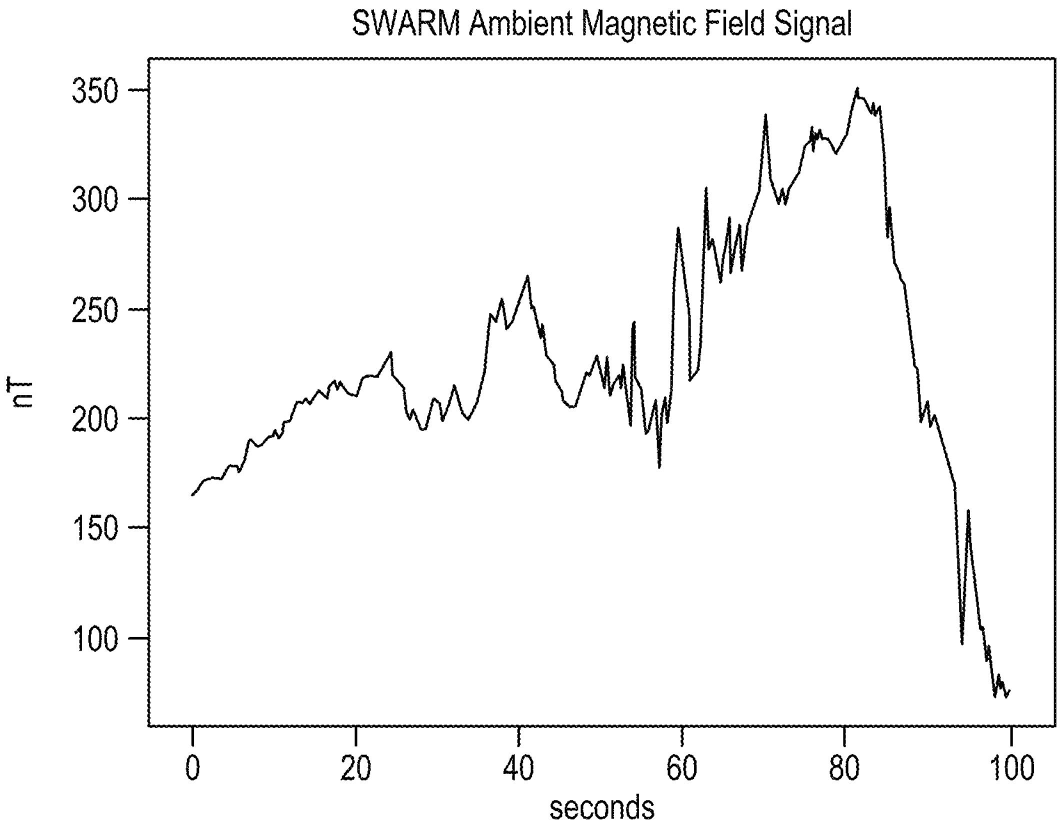
FIG. 2 is a graph illustrating a magnetic perturbation signal generated by subtracting the IGRF magnetic field model from in situ observations by the SWARM. A satellite on Mar. 17, 2015 between 8:53 and 8:55 UTC.

The WAIC-UP algorithm was evaluated in three experiments involving boomless platforms. The first two experiments utilized a mock CubeSat platform with laboratory-generated interference signals from an opensource dataset. The third experiment simulated a CubeSat with random interference signals and source locations. In every experiment, we used geomagnetic perturbation data was used from the SWARM A spacecraft as the ambient magnetic field signal. The SWARM A spacecraft recorded this data on Mar. 17, 2015 between 8:53 and 8:55 UTC, while flying over the southern auroral zone between the 69th and 76th parallel south. This segment of the orbit contains a higher concentration of high-frequency signal content and is depicted in FIG. 2.

A. WAIC-UP Application to Real Magnetic Field Data

Two experiments were conducted to assess the WAIC-UP algorithm using real-world data. Both experiments employed real stray magnetic field data from opensource data sets. These data sets utilized current-driven copper coils inside a mock CubeSat to generate stray magnetic field signals. These signals were measured using three PNI RM3100 magnetometers 12*a*-12*c* in a copper room shielded by mu-metal. The experimental mock CubeSat setup 10 is shown in FIG. 3.

The PNI RM3100 is a low-cost magneto-inductive magnetometer that exhibits increased measurement uncertainty at higher sampling rates. The first data set featured three PNI RM3100 magnetometers 12*a*-12*c* and four copper coils 14*a*-14*d*, which generated a 0.8 Hz sine wave, a 0.4 Hz sine wave, a 1 Hz square wave, and a 2 Hz square wave. The magnetometers 12*a*-12*c* were sampled for a total of 100 seconds at 50 Hz (N=5000) and have an expected measurement uncertainty of 8 nT. We virtually added the SWARM magnetic perturbation data to each magnetometer 12*a*-12*c* to simulate the ambient magnetic field. FIG. 4 displays the initial 20 seconds of the mixed magnetometer signals.

The WAIC-UP algorithm was applied to the three magnetometer measurements to derive the estimated ambient magnetic field signal. The results were compared with those obtained using a single magnetometer with the least interference present (denoted minimum), and Underdetermined Blind Source Separation (UBSS). To evaluate performance, four metrics were employed: signal-to-noise ratio (SNR), Pearson correlation coefficient (ρ), and root mean square error (RMSE), and execution runtime.

The SNR is calculated as follows, where $x_i$ represents the true signal values, $\bar{x}$ is the mean of the true signal, $y_i$ is the estimated signal value, and n is the number of data points:

$$SNR(db) = 10\log_{10}\frac{\sum_i^n = 1(x_i-\bar{x})^2}{\sum_i^n = 1(x_i-y_i)^2} \tag{12}$$

The Pearson correlation coefficient is calculated using (Eq. 13), where $x_i$ and $y_i$ are the true and estimated signal values, respectively, $\bar{x}$ and $\bar{y}$ are the means of the true and estimated signals, respectively, and n is the number of data points:

$$p = \frac{\sum_i^n = 1(x_i-\bar{x})(y_i-\bar{y})}{\sqrt{\sum_i^n = 1(x_i-\bar{x})^2}\sqrt{\sum_i^n = 1(y_i-\bar{y})^2}} \tag{13}$$

The RMSE is calculated using (Eq. 14), where $x_i$ and $y_i$ are the true and estimated signal values, and n is the number of data points:

$$RMSE(nT) = \sqrt{\frac{\sum_i^n = 1(x_i-y_i)^2}{n}} \tag{14}$$

The table of FIG. 11 summarizes the results of the first experiment, which involved three magnetometers and four noise sources. The execution time for each algorithm, using Intel Core i7-1255U CPU, is presented in the Time column. The UBSS algorithm is parallelizable was executed using 10 processes, while the WAIC-UP algorithm utilized a single process.

For the second experiment, the dataset was generated using four copper coils 14*a*-14*d* and a Quad-Mag. The Quad-Mag is an experimental CubeSat magnetometer that consists of four PNI RM3100 magnetometers 12 on an integrated electronics board. The Quad-Mag was positioned at the bottom of the mock CubeSat. Four copper coils 14*a*-14*d* were placed above the mock CubeSat within the 3U CubeSat volume. The copper coils were driven by a 0.8 Hz sine wave, a 5 Hz sine wave, a 2 Hz sawtooth wave, and a 3 Hz attenuating sine wave. The signals were sampled for a total of 150 seconds at 65 Hz (N=9750). At this frequency, a single PNI RM3100 magnetometer has a measurement uncertainty of approximately 10.5 nT. We virtually added the SWARM magnetic perturbation data to each magnetometer in the Quad-Mag to simulate the ambient magnetic field.

The results of applying WAIC-UP to separate the interference signals from the ambient magnetic field signal are shown in the table of FIG. 12.

These results demonstrate that WAIC-UP achieved comparable correlation, SNR, and RMSE to UBSS, but with significantly less execution time. The reduced computational complexity of the WAIC-UP algorithm allows us to test the effectiveness of WAIC-UP using more data-intensive methods. In Section B, a Monte Carlo simulation of WAIC-UP applied to stray magnetic field noise present in a 1U CubeSat is provided.

B. Simulation of Randomized Interference Sources

The performance of the WAIC-UP algorithm was evaluated by conducting thousands of simulations with randomized noise source locations and stray magnetic field signals. The Magpylib Library was used to simulate the stray magnetic field signals. Four magnetic dipoles were simulated as interference sources and four virtual magnetometers 12 in the Quad-Mag configuration. The dipoles were placed randomly within a 1U (10 cm×10 cm×10 cm) volume and at least 10 mm above the virtual Quad-Mag. The dipole noise sources were modeled with current loops that have magnetic moments between $1.57\times10^{-4}$ $Am^2$ and $5.89\times10^{-4}$ $Am^2$ (i.e., up to 500 nT at 5 cm). To simulate a worst-case scenario, the dipoles were aligned such that their noise signals cumulatively added to each other. It is important to note that Magpylib's simulation of stray magnetic field interference does not account for the presence of conductors or induction currents that may be present in a spacecraft. FIG. 5 illustrates a virtual CubeSat with four interference sources and four sensors.

In each simulation, 100 seconds of data is collected from the virtual magnetometers sampled at 50 Hz. We added 10 nT of random normal noise to mimic the measurement uncertainty of a PNI RM3100 magnetometer at this sample rate. To simulate the stray magnetic field signals, three source signals were generated. These source signals include a simulated reaction wheel signal with 15 Hz and 20 Hz components, a square wave with a principal frequency of 5 Hz, and a 3 Hz sine wave. The sine and square wave source signals were randomly turned on and off throughout the window. The fourth stray magnetic field was a 24-hour sample of interference taken from the Michibiki-1 magnetometers. The interference was calculated using the simple formula $b_{interference}=b_{in}-b_{out}$, in order to subtract the ambient magnetic field. This is a 1 Hz signal that was randomized by selecting a random slice with the same length as the 100-second, 50 Hz signal. The same SWARM A magnetic perturbation data was added equally to each virtual magnetometer in every simulation. FIG. 6 shows a 26-second plot of the noisy magnetometer signals from the simulation with the same source configuration as in FIG. 5. The four interference signals are clearly visible as periodic fluctuations on top of the ambient signal. The interference signals have different frequencies and amplitudes, and they affect each magnetometer differently.

1550 randomized simulations were conducted and recorded the RMSE, correlation, and SNR for the magnetometer with the least interference in each simulation (denoted minimum), the four-magnetometer averaged signal, and the signal cleaned by WAIC-UP. The table in FIG. 13 presents the median results of the 1550 randomized simulations. WAIC-UP outperformed both the minimum and the averaged signals, achieving higher correlation and SNR, as well as lower RMSE. However, the median RMSE of WAIC-UP is larger than the lower bound average normal error of 5 nT for the Quad-Mag.

The correlation of the WAIC-UP, minimum, and averaged signals were compared to the true ambient magnetic field signal. FIG. 7 displays the box plots of the correlation coefficients for the randomized simulations. The box plots demonstrate that WAIC-UP can enhance the median correlation to above 0.99, with only a few outliers below 0.98. The averaged signal exhibits a higher correlation than the minimum magnetometer signal, but both have significantly lower correlations compared to the WAIC-UP signal.

Additionally, the RMSE of the minimum, averaged, and cleaned signals were compared to the true ambient magnetic field signal. FIG. 8 presents the box plots of the log RMSE for the simulations. The box plots reveal that WAIC-UP can significantly reduce the RMSE by several orders of magnitude. The lowest RMSE achieved by WAIC-UP was 4.03 nT, down from an average of 66.71 nT. The highest RMSE achieved by WAIC-UP was 1802.72 nT, reduced from an average of 1890.75 nT. In this simulation with high interference, three of the interference sources were placed very close to each other and directly above one virtual magnetometer.

The SNR of the minimum, WAIC-UP, and averaged magnetometer signals were evaluated. FIG. 9 illustrates the probability distribution of the SNR values. Both the averaged and minimum signals have a mean SNR below 0 dB. The distribution of the WAIC-UP SNR is shifted to the right of the average and minimum signals, signifying a substantial improvement in SNR. Interestingly, the WAIC-UP SNR distribution has a bimodal peak at 19.1 dB and 13.9 dB. When comparing the change in SNR among the three signals, WAIC-UP had a mean increase of 417.5 dB from the averaged signal and 427.06 dB from the minimum signal. This indicates that the use of WAIC-UP can significantly enhance the SNR of the magnetometer signal compared to simply averaging or using the magnetometer with the least interference. We also observe from this distribution that 92.6% of the SNR values for WAIC-UP are above 0 dB while the minimum magnetometer signal has 0.9% of the SNR values above 0 dB.

Lastly, the distribution of the correlation and SNR of the WAIC-UP signals are assessed. FIG. 10 displays a scatter plot of the correlation and SNR of the WAIC-UP signals from the randomized simulations. The data points are colored by density, with subplots at the top and to the right depicting the distribution of data points along each axis. This plot demonstrates that WAIC-UP is highly effective at increasing the correlation to nearly 1.

The simulation results demonstrate that WAIC-UP is an effective method for cleaning magnetometer signals in the presence of stray magnetic field interference. This approach not only reduces the RMSE and significantly enhances the SNR, but also improves the correlation coefficient between the estimated and true signals. The results also indicate that WAIC-UP performs far better than simply taking the magnetometer with the least noise present or averaging the magnetometer signals.

DISCUSSION

In the experiments conducted using real magnetic field data from open-source datasets, it was observed that WAIC-UP effectively removed stray magnetic field interference from magnetometer measurements in a boomless configuration. The first dataset involved three PNI RM3100 magnetometers 12 and four stray magnetic field signals 14*a*-14*d*, while the second dataset used the Quad-Mag magnetometer 12 and four stray magnetic field signals 14*a*-14*d*. In the first experiment, the magnetometer with the least interference had an RMSE of 260 nT. WAIC-UP reduced this to 9.08 nT, and UBSS reduced the interference to 8.79 nT. Both algorithms improved the SNR by over 28 dB and increased the correlation to above 0.999. In the second experiment with the Quad-Mag 12, the magnetometer with the least interference had an RMSE of 42.33 nT. WAIC-UP and UBSS managed to reduce the interference to 4.94 nT and 4.40 nT, respectively. This result was below the expected measurement uncertainty for sampling the PNI RM3100 at 65 Hz. WAIC-UP also achieved comparable results to UBSS in terms of correlation and SNR. The magnetometer settings in these experiments had different random normal noise characteristics and sample rates. The spectral content of the stray magnetic field interference varied as well. Despite these differences, WAIC-UP consistently achieved comparable results in both experiments. The significant difference between WAIC-UP and UBSS is that WAIC-UP has a lower computational complexity, with over a factor of 20 reduction in run-time from 102.78 seconds by UBSS to 4.61 seconds by WAIC-UP when processing nearly 10,000 data points in the second experiment.

Subsequently, over 1500 randomized simulations were conducted to perform a statistical analysis of WAIC-UP's efficacy. In these simulations, stray magnetic field interference sources were randomly located and turned on and off sporadically. Real spacecraft interference data from the Michibiki-1 satellite were also incorporated as an interference signal. WAIC-UP consistently achieved a correlation with the true magnetic field exceeding 0.99 in these simulations. The median RMSE obtained from averaging the Quad-Mag signals was nearly 77 nT, while the median RMSE from the WAIC-UP signals was 11.33 nT. The simulations added 10 nT of random normal error to each virtual magnetometer in order to match the specifications of the PNI RM3100 magnetometer, but most heliophysics research demands magnetic field measurements with accuracy better than 1 nT. Despite this, the 11.33 nT RMSE is suitable for attitude determination and many magnetospheric science investigations such as monitoring field-aligned currents.

The WAIC-UP algorithm operates under certain assumptions that may limit its applicability. First, it assumes that the ambient magnetic field signals and the interference signals have no correlation. Second, it assumes that the interference signals occupy distinct wavelet scales. Additionally, WAIC-UP assumes that the interference signal is much larger than the random normal noise of the magnetometer. If these assumptions are violated, the algorithm might produce inaccurate results. However, a possible solution to multiple interference signals occupying the same scale-band is to use more than two magnetometers and find the optimal pair of magnetometers with the minimum interference level. We found that adding more spatially distributed magnetometers improves the performance of the algorithm. Quantitatively characterizing the performance of WAIC-UP with respect to the number of magnetometers is a potential area of future work. It is worth noting that WAIC-UP is a blind algorithm, but in real satellite scenarios, one often knows the noise sources' locations and potentially their spectral signatures. These simulations could inform future magnetic cleanliness designs. Future research could also explore alternative wavelet transforms that offer better time-frequency resolution than the Morlet wavelet used in this study. Another challenge posed by this algorithm is its inability to handle low-frequency signals, which are crucial for space physics research. Space physics research often relies on absolute magnetic field measurements to determine the behavior of space plasmas. WAIC-UP detrends the magnetometer signals with a uniform filter and is not able to remove DC interference. However, other algorithms are available that can calibrate the DC offsets of magnetic field measurements in situ.

According to the principles of the present teachings, a method is provided for removing stray magnetic field interference from boomless spacecraft magnetometers. The WAIC-UP algorithm is an extension of an adaptive interference cancellation algorithm that can remove a single interference signal. WAIC-UP can remove interference in an underdetermined time-domain mixing system through taking a wavelet transformation. WAIC-UP performs similarly to UBSS, a leading interference removal algorithm. WAIC-UP also shows a very high correlation with the true magnetic field signal in many simulations. The WAIC-UP algorithm makes minimal assumptions about the stray magnetic field signals. The Monte Carlo simulations demonstrate that the algorithm can be applied to CubeSats with various interference sources, enabling low-cost boomless spacecraft for future space exploration.

CONCLUSION

The present disclosure investigated the effectiveness of the WAIC-UP algorithm, a new wavelet-based noise identification method, in removing stray magnetic field interference from boomless spacecraft magnetometer measurements. The findings demonstrated that the WAIC-UP algorithm offers performance comparable to the state-of-the-art UBSS interference removal algorithm, with a twentyfold reduction in execution time. In an experiment with three magnetometers and four interference signals, WAIC-UP achieved an increase in correlation from 0.6843 to 0.9993, an SNR improvement from −0.65 dB to 28.48 dB, and an RMSE reduction from 259.68 nT to 9.08 nT (near the normal noise floor of the instrument). Similarly, in an experiment with the Quad-Mag magnetometer and four interference signals, WAIC-UP yielded a correlation increase from 0.8075 to 0.9964, an SNR enhancement from 2.76 dB to 21.42 dB, and an RMSE reduction from 42.33 nT to 4.94 nT. These results highlight the significant improvements in magnetometer signal quality, which are crucial for various applications, including spacecraft navigation, attitude control, and space physics research.

In addition to conducting real-world experiments, over 1500 randomized simulations were performed to statistically evaluate the efficacy of the WAIC-UP algorithm. The results revealed that WAIC-UP provides a substantially better estimation than merely selecting the magnetometer signal with the minimum noise. The median correlation increased from 0.2468 to 0.9937, the median SNR improvement was from −12.39 dB to 14.21 dB, and the median RMSE reduction was from 26.31 nT to 11.33 nT. Furthermore, the performance of the WAIC-UP cleaned signal significantly outperformed the results obtained by simply averaging the magnetometer signals. When comparing the WAIC-UP signals to the averaged magnetometer signals on a simulation-by-simulation basis, WAIC-UP demonstrated a mean increase in SNR of Δ18.13 dB.

While the algorithm operates under certain assumptions that may limit its applicability, potential solutions and future research could address these limitations. Ultimately, WAIC-UP showcases its potential for application in CubeSats with diverse interference environments, facilitating the development of low-cost boomless spacecraft for future space exploration. The success of WAIC-UP in these experiments underscores its potential to facilitate more compact satellite designs, and represents a crucial step towards more efficient and cost-effective magnetometer designs for space missions.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A magnetometer system for measuring magnetic field for navigation of a spacecraft and providing a magnetically clean signal comprising:

at least a pair of magnetometers operably coupled to a body of the spacecraft, the at least a pair of magnetometers being exposed to multiple stray magnetic field signals from onboard electrical systems, a magnitude and frequency of these multiple stray magnetic field signals vary according to the spacecraft's configuration and operation mode, the at least a pair of magnetometers outputting a mixed magnetometer signal in a discrete-time domain; and a processor system detrending the mixed magnetometer signal and applying a wavelet-transform to the mixed magnetometer signals, the difference between the mixed magnetometer signals is calculated and a correlation is taken with the difference in the mixed magnetometer signals and that correlation gives an interference signal, the interference signal is cancelled from the mixed magnetometer signals and a filtered resultant signal is output to be used in a navigation system.

2. The magnetometer system according to claim 1, wherein the wavelet-transform is a continuous wavelet-transform function.

3. The magnetometer system according to claim 1, wherein the processor is on-board the spacecraft.

4. The magnetometer system according to claim 1, wherein the processor is on the ground.

5. The magnetometer system according to claim 1, wherein the at least a pair of magnetometers include three magnetometers.

6. A magnetometer system for measuring magnetic field for space science investigations and providing a magnetically clean signal comprising:

at least a pair of magnetometers operably coupled to a body of a spacecraft, the at least a pair of magnetometers being exposed to multiple stray magnetic field signals from onboard electrical systems, a magnitude and frequency of these multiple stray magnetic field signals vary according to the spacecraft's configuration and operation mode, the at least a pair of magnetometers outputting a mixed magnetometer signal in a discrete-time domain; and a processor detrending the mixed magnetometer signal and applying a wavelet-transform to the mixed magnetometer signals, the difference between the mixed magnetometer signals is calculated and a correlation is taken with the difference in the mixed magnetometer signal and that correlation gives the interference signal, the interference signal is cancelled from the mixed magnetometer signals and a filtered resultant signal is output to be used in a navigation system.

7. The magnetometer system according to claim 6, wherein the wavelet-transform is a continuous wavelet-transform function.

8. The magnetometer system according to claim 6, wherein the processor is on-board the spacecraft.

9. The magnetometer system according to claim 6, wherein the processor is on the ground.

10. The magnetometer system according to claim 6, wherein the at least a pair of magnetometers include three magnetometers.

11. A spacecraft comprising:

a spacecraft body;

at least a pair of magnetometers operably coupled to the spacecraft body, the at least a pair of magnetometers being exposed to multiple stray magnetic field signals from onboard electrical systems, a magnitude and frequency of these stray magnetic field signals vary according to the spacecraft's configuration and operation mode, the at least a pair of magnetometers outputting a mixed magnetometer signal in a discrete-time domain; and a processor detrending the mixed magnetometer signal and applying a wavelet-transform to the mixed magnetometer signals, the difference between the magnetometer signals is calculated and a correlation is taken with the difference in the magnetometer signal and that correlation gives the interference signal, the interference signal is cancelled from the mixed magnetometer signals and a filtered resultant signal is output to be used in a navigation system.

12. The magnetometer system according to claim 11, wherein the wavelet-transform is a continuous wavelet-transform function.

13. The magnetometer system according to claim 11, wherein the processor is on-board the spacecraft.

14. The magnetometer system according to claim 11, wherein the processor is on the ground.

15. The magnetometer system according to claim 11, wherein the at least a pair of magnetometers include three magnetometers.

* * * * *